United States Patent [19]
Tsai et al.

[11] Patent Number: 5,108,937
[45] Date of Patent: Apr. 28, 1992

[54] METHOD OF MAKING A RECESSED GATE MOSFET DEVICE STRUCTURE

[75] Inventors: Yu-Hsein Tsai, Hsin Chu; Shun-Liang Hsu, Taipei, both of Taiwan

[73] Assignee: Taiwan Semiconductor Manufacturing Company, Hsinchu, Taiwan

[21] Appl. No.: 649,550

[22] Filed: Feb. 1, 1991

[51] Int. Cl.⁵ .......................................... H01L 21/265
[52] U.S. Cl. ...................................... 437/40; 437/69; 437/154; 437/913; 148/DIG. 53
[58] Field of Search ...................... 437/40, 41, 45, 913, 437/69, 203, 154, 29

[56] References Cited

U.S. PATENT DOCUMENTS

| | | | |
|---|---|---|---|
| 4,455,740 | 6/1984 | Iwai | 156/648 |
| 4,685,196 | 8/1987 | Lee | 437/203 |

FOREIGN PATENT DOCUMENTS

| | | | |
|---|---|---|---|
| 0321347 | 6/1989 | European Pat. Off. | 437/40 |
| 0029461 | 2/1984 | Japan | 437/40 |
| 0092666 | 5/1985 | Japan | 437/203 |
| 0296472 | 12/1987 | Japan | 437/40 |
| 0287064 | 11/1988 | Japan | 437/40 |
| 0179361 | 7/1989 | Japan | 437/40 |
| 0179362 | 7/1989 | Japan | 437/40 |

*Primary Examiner*—Brian E. Hearn
*Assistant Examiner*—Michael Trinh
*Attorney, Agent, or Firm*—George O. Saile

[57] ABSTRACT

A method of producing an improved field effect transistor integrated circuit device in a semiconductor substrate embodying a first type dopant and having a recessed gate electrode and self-aligned source and drain regions can be made. A first masking layer is formed on the surface of said semiconductor substrate that is capable of masking the underlying silicon against oxidation. Portions of first masking layer is removed to form openings that at least define the gate electrode regions. The resultant exposed silicon area are oxidized to produce a thick sunken silicon oxide layer. The first masking layer is removed. A second opposite type dopant is introduced into the substrate on opposite sides of the sunken thick oxide layer that defines the region of the gate electrode to form source and drain regions. The sunken thick oxide layer is selectively removed, thereby forming a depression in the substrate that defines the gate region. A thin oxide layer is formed over the source and drain regions, and in the depression in the said substrate. A conductive gate electrode layer is formed on the surface of substrate. Portions of the conductive layer are selectively removed to form the gate electrode in the depression. An insulating layer is formed over the gate electrode. Electrical contacts and metallurgy lines with appropriate passivation are formed. The elements of the transistor are connected by these contacts and lines to form the integrated circuit device.

6 Claims, 2 Drawing Sheets

METHOD OF MAKING A RECESSED GATE MOSFET DEVICE STRUCTURE

BACKGROUND OF THE INVENTION (1) Field of the Invention

This invention relates to improved recessed gate field effect transistor devices and methods of making, and more particularly to metal oxide semiconductor (MOS) field effect transistors with recessed gates that are fabricated with the use of self-aligned source and drain regions and recessed oxide technology.

(2) Description of the Prior Art

In semiconductor manufacturing, the cost of semiconductor devices is directly related to the number and size of devices, and their related functions, which can be placed on a single semiconductor chip. Also, affecting the cost is the number and complexity of the manufacturing steps needed to fabricate the integrated circuit devices.

Initially, efforts to increase device density was limited primarily by photolithographic dimensional limitations. Subsequently, techniques have become available which enable dimensions of less than one micron to be used in photolithographic processing. Semiconductor processing techniques which reduce the number of processing steps and/or their complexity are also useful to lower the cost of semiconductor devices by increasing product yield or by increasing density, when the number of critical mask alignment steps can be reduced.

In the manufacture of MOSFET integrated circuit devices, however, a reduction in size, achievable with newer photolithographic techniques, presented other formidable problems. When the size of the conventional MOS FET device structure where the source, drain, and gate regions are all spaced along a planar surface the threshold voltage is reduced. Reduction of the threshold voltage results in punch through. A well known scaling method is effective to improve the aforementioned problems. This method dictates reduction of the supply voltage and also an increase of the substrate density. Reduction of the supply voltage leads to reduction of the margin concerning the electric noise and fluctuations of the threshold voltage. Increasing the substrate density is likely to result in increased current leakage in the sub-threshold region. The significance of these problems is increased as integration density is increased.

A MOS field effect transistor device structure that seeks to increase the effective length of the channel length is shown in U.S. Pat. No. 4,455,740 where a groove is formed between the source and drain and the gate insulation and gate electrode place in the groove. However, the fabrication requires a complex fabrication process.

SUMMARY OF THE INVENTION

It is an object of this invention to provide an improved MOS FET integrated circuit device structure that will eliminate the source to drain leakage, which can be miniaturized, and which uses process technology for fabrication that is compatible with associated device fabrication.

Another object of the invention is to provide a method of fabricating an improved MOS FET device that used self-alignment techniques, and a minimum number of process steps.

Yet another object of the invention is to provide a new MOS FET device structure that virtually eliminates source to drain leakage, and which can be produced with process techniques that do not require exacting, critical alignment steps.

A feature of the invention is that sunken silicon dioxide regions, known as LOCOS, is used to form the depression for the gate electrode. This step provides a precise control of the depth of the depression. Further, the source and drain regions are formed before the thick silicon oxide is removed, thereby providing self-alignment of the ion implantation of these regions.

Another feature of the invention is that reactive ion etching or similar dry etching technique can be used to planarize the surface topology of the sunken field oxide and polycrystalline silicon gate features. This additional step facilitates the metallization and interconnection of the MOS FETs on the integrated circuit substrate.

The method of producing an improved field effect transistor integrated circuit device in a semiconductor substrate embodying a first type dopant and having a recessed gate electrode and self-aligned source and drain regions may be made as follows. A first masking layer is formed on the surface of said semiconductor substrate that is capable of masking the underlying silicon against oxidation. Portions of first masking layer is removed to form openings that at least define the gate electrode regions. The resultant exposed silicon area are oxidized to produce a thick sunken silicon oxide layer. The first masking layer is removed. A second opposite type dopant is introduced into the substrate on opposite sides of the sunken thick oxide layer that defines the region of the gate electrode to form source and drain regions. The sunken thick oxide layer is selectively removed, thereby forming a depression in the substrate that defines the gate region. A thin oxide layer is formed over the source and drain regions, and in the depression in the said substrate. A conductive gate electrode layer is formed on the surface of said substrate. Portions of the conductive layer are selectively removed to form the gate electrode in the depression. An insulating layer is formed over the gate electrode. Electrical contacts and metallurgy lines with appropriate passivation are formed. The elements of the transistor are connected by these contacts and lines to form the integrated circuit device.

An improved MOS field effect transistor integrated circuit device is also envisioned by the invention. A monocrystalline silicon substrate embodying a first type of conductivity is provided. Spaced source and drain regions of a second opposite type conductivity are in the substrate. The regions having a first region adjacent to the surface of the substrate is provided with a dopant concentration of between about $1 \times 10^{18}$ to $1 \times 10^{21}$ atoms/cubic cm. A second underlying region beneath the first region is provided with a dopant concentration of between about $1 \times 10^{16}$ to $1 \times 10^{19}$ atoms/cubic cm. A depression is located between the source and drain regions. Sunken field oxide areas surround the source and drain regions and said depression. The depth of the field oxide and the depression into the substrate being approximately equal. A thin layer of silicon dioxide is located over the surface of the depression and the sunken areas over the source and drain regions. The source and drain regions are positioned between and in abutting relation to the sunken field oxide and the silicon dioxide layer lining the surface of the depression. The depth of the source and drain regions are approximately equal to the depth of the depression. The silicon dioxide layer is located over the surfaces of the depression is the gate dielectric layer. A layer of conductive material in depression forms the gate electrode of the device. Electrical contacts are made to the elements of transistor and are so connected with similar such transistors to form desired integrated circuit device.

DESCRIPTION OF THE PREFERRED EMBODIMENTS

Figure 1:
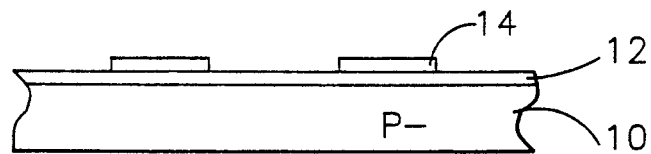
FIGS. 1 through 6 is one embodiment of a series of cross sectional that illustrate a preferred specific embodiment of the method of producing the device structure of the present invention at various stages of its fabrication.

Referring now to the FIGS. 1 to 6 of the drawing, there is depicted in FIG. 1 a silicon substrate 10 that embodies a first dopant for semiconductors, preferably in concentration between about $1 \times 10^{13}$ to $1 \times 10^{17}$ atoms/cubic cm. The substrate 10 is monocrystalline silicon, although polycrystalline silicon, III-V compound semiconductors, silicon on insulator (SOI), silicon on saphire (SOS), etc. could possibly be utilized. The dopant can be either P or N, depending on the type of MOS FET desired to be made as is well understood in the art.

An oxidation resistant mask is then formed on the top surface of the substrate 10. Preferably the surface of the substrate 10 is oxidized forming silicon oxide layer 12 having a thickness in the range of about 50 to 1000 Angstroms. A nitride layer is deposited over the layer 12 by well known and conventional techniques. Portions of the nitride layer is selectively removed using standard lithography and etching techniques. Areas 14 remain after the etching and they define the planned source and drain regions. The areas of the silicon nitride removed are over the planned gate electrode regions and also preferably over the field areas of the substrate.

Figure 2:
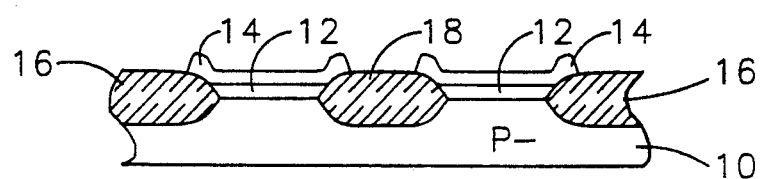

Now, as shown in FIG. 2, the substrate 10 is placed in an oxidizing environment to form the sunken silicon oxide areas 16 and 18 having an overall thickness of between about 200 to 2000 nanometers. The silicon oxide has a penetration into the substrate between about 80 to 800 nanometers. The procedure per se is known, and is commonly known as LOCOS technology. Areas 18 defines the gate electrode locations and areas 16 define field silicon oxide areas.

Figure 3:
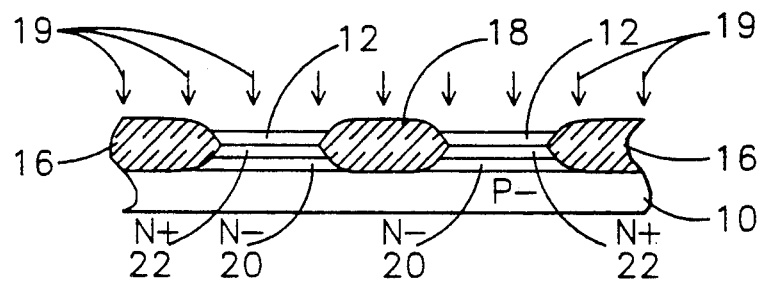

As shown in FIG. 3, the silicon nitride layer 14 is now removed. Dopant ions of a second opposite conductivity type are introduced into the substrate 10 to form the source and drain regions. The dopant ions can be either P or N type depending on the type of device desired. Preferably, the source and drain regions are formed using ion implantation techniques. Note that the dopant ions use the thick silicon oxide areas 16 and 18 to confine these regions. Preferably the source and drain regions are graded, that is the regions are formed of a first highly doped region 22 adjacent the surface of the substrate 10, and a second lightly doped region 20 underlying the region 22. These regions can be formed, for example by the double diffused method. Where N channel MOS FET devices are being formed, arsenic and phosphorous ions are implanted into the source and drain regions. The arsenic ions are planned to form the N+ surface region 22 and the phosphorous ions are planned to form the underlying N− region, so the concentration of ions implanted are accordingly adjusted. The structure is annealed to cause the formation of the two regions 22 and 20, since phosphorous moves faster than does arsenic in silicon at elevated temperatures. The N+ region 22 has an average dopant concentration between about $1 \times 10^{18}$ to $1 \times 10^{21}$ atoms/cubic cm. and the N− region 20 has an average dopant concentration between about $1 \times 10^{16}$ to $1 \times 10^{19}$ atoms/cubic cm. The ion bombardment is indicated by arrows 19.

Figure 4:
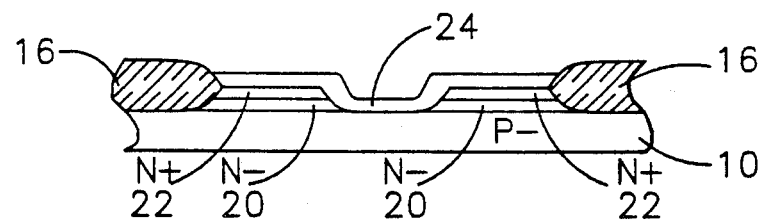

As indicated in FIG. 4, the sunken silicon oxide area 18 is selectively removed using conventional masking and etching technology. A conventional block out mask is used to cover other areas. The etchant used preferably is a buffered hydrofluoridic acid solution. A gate silicon oxide 24 is then formed in the resulting depression, and also over the exposed source and drain regions. A conductive layer 25 is deposited and selectively removed using standard photolithographic and etching techniques to leave the gate electrode 26. The gate electrode is preferably formed of polysilicon giving a thickness equal to or greater than the depth of the depression. The thickness preferred is between about 200 to 1000 nanometers. The polysilicon can be deposited either as doped or undoped. If the polysilicon is deposited undoped, it is then doped to a concentration of between about $1 \times 10^{18}$ to $1 \times 10^{21}$ atoms/cubic cm. However, the gate electrode 26 can be composed of other conductive materials, such as aluminium alone, aluminium with silicon and/or copper, aluminium and refractory metal compounds (AlHf, AlSiTi, etc., refractory metals, etc.

Figure 7:
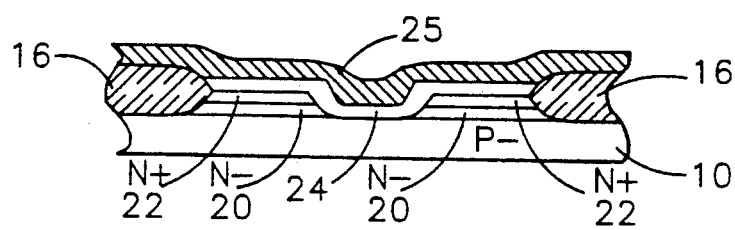
FIGS. 7 and 8 illustrate alternate and additional steps in the FIG. 1 through 6 that provide for planarizing the surface of the topology of the substrate.
Figure 8:
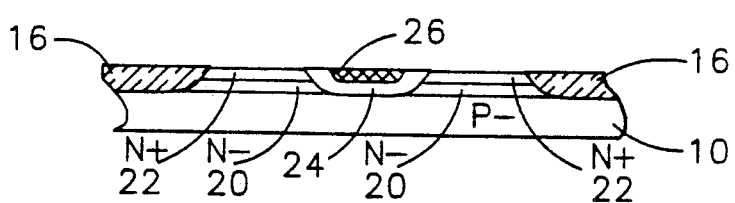

When the gate electrode 26 is polysilicon, it may be desirable to planarize the topology to facilitate the metallization and interconnection of the MOS FETs and associated elements on the substrate. This operation is indicated in FIG. 7 and FIG. 8. As indicated, a blanket of polysilicon layer 25 is deposited on the surface of the substrate 10 that has a thickness of at least the depth of the gate depression as shown in FIG. 7. As indicated in FIG. 8, the top surface of the substrate is exposed to a dry etching atmosphere, such as reactive ion etchback operation, leaving a planar to surface. The planarization process can be accomplished either by first depositing a very thick material like photoresist or polysilicon and then using the conventional reactive ion etching process to etch back until the upper surfaces of the field oxide, source and drain regions and polysilicon gate electrode are all in substantially the same plane as shown in FIG. 8.

Figure 9:
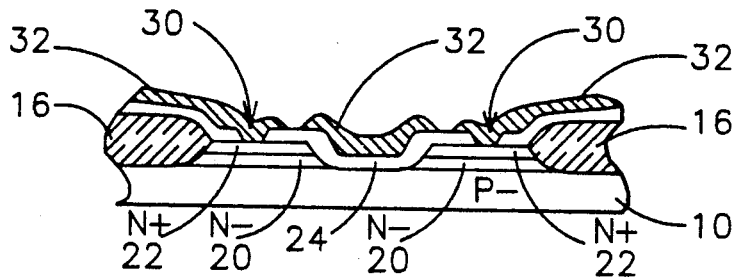
FIG. 9 illustrates an altenate embodiment which uses the same metal for forming the gate electrodes and the source/drains simultaneously.

When the gate electrode is metal, for example aluminium or an aluminium compound the contact openings 30 of the source and drain regions are formed before metal deposition so that the gate electrodes and contacts to the sources/drains are simultaneously formed and then patterned. The final structure is as is shown in FIG. 9. In this device structure, the gate electrode is the same metallurgy as the contacts as indicated at 32 in FIG. 9.

Figure 5:
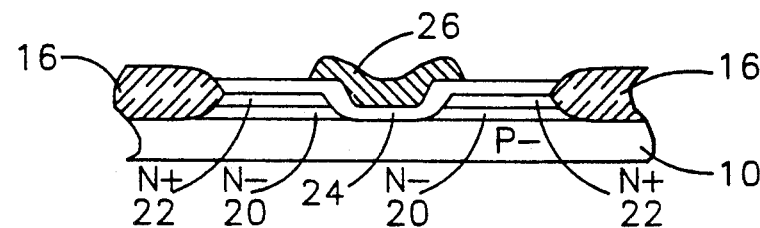
Figure 6:
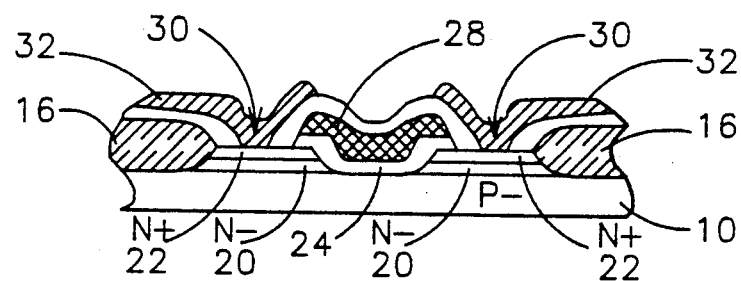

The device structure of FIG. 5 is then completed as shown in FIG. 6. A thin insulating layer 28 is formed over gate electrode 26 and contact openings 30 made for the source and drain regions. When the gate electrode is polysilicon, the layer can be formed over the gate by oxidation. Metallurgy line or stripes 32 are fabricated to make contact with the source and drain regions, using standard deposition and lithography and etching techniques.

The metallurgy system (not shown) including passivation to interconnect the elements of the MOS FET (shown in the drawings), associated MOS FETs (not shown in the drawing) and other devices (not shown) on the substrate is now formed by conventional techniques to form the desired integrated circuit device.

The two major advantages obtained from this process and resulting structure are to minimize the source to drain leakage problem and to provide a substantially planar surface topology that facilitates the metallization and interconnection of the MOS FETs. Further, where metal is used, rather than polysilicon as the gate electrodes, conductivity of the metallurgy is improved.

While the invention has been particularly shown and described with reference to the preferred embodiments thereof, it will be understood by those skilled in the art that various changes in form and details may be made without departing from the spirit and scope of the invention.

What is claimed is:

1. A method of producing an improved field effect transistor integrated circuit device in a silicon semiconductor substrate embodying a first P-type dopant and having a recessed gate electrode and self-aligned source and drain regions, the improvement comprising:
   forming a first composite masking layer of a surface layer of silicon oxide and an overlying layer of silicon nitride on the surface of said semiconductor substrate that is capable of masking the underlying silicon against oxidation;
   removing portions of said first composite masking layer to form openings of exposed silicon that at least define the gate electrode regions;
   oxidizing the exposed silicon to produce a sunken silicon oxide layer;
   removing said silicon nitride layer of said composite first masking layer;
   introducing an N-type dopant into said substrate on opposite sides of the sunken thick oxide layer that defines the region of the gate electrode to form source and drain regions;
   said N-type dopant including both arsenic and phosphorous ions and annealing to cause penetration into the substrate to unequal depths, the surface concentration in the range of $1 \times 10^{14}$ and $1 \times 10^{17}$ atoms per cubic centimeter;
   removing said silicon oxide layer of said composite first masking layer;
   selectively removing the sunken oxide layer, thereby forming a depression in the substrate that defines the gate region, having a depth in the range of 200 to 2000 nanometers;
   forming a thin oxide layer over the source and drain regions and in the depression in the said substrate;
   forming a conductive gate electrode layer on the surface of said substrate, selectively removing portions of said conductive layer to form the gate electrode in the said depression;
   forming an insulating layer over the gate electrode;
   and forming electrical contacts and metallurgy lines with appropriate passivation, and connecting the elements of the said transistor by these contacts and lines to form said integrated circuit device.

2. The method of claim 1 wherein the openings in said first layer also define regions of field oxide.

3. The method of claim 1 wherein the said arsenic ions form an N+ surface region and the said phosphorous ions form a N− region below said N+ surface region to provide a lightly doped drain structure device.

4. The method of claim 3 wherein the average dopant concentration in said N+ surface region is between about $1 \times 10^{18}$ to $1 \times 10^{21}$ atoms per cubic cm. and the average dopant concentration in said N− region is between about $1 \times 10^{16}$ to $1 \times 10^{19}$ atoms per cubic cm.

5. The method of claim 1 wherein the conductive gate electrode layer and contacts to the source/drain regions are formed simultaneously from a metal.

6. The method of claim 5 wherein the said metal is aluminium.

* * * * *